United States Patent
Fujii et al.

(10) Patent No.: US 8,710,716 B2
(45) Date of Patent: Apr. 29, 2014

(54) ACTUATOR, ACTUATOR STRUCTURE AND METHOD OF MANUFACTURING ACTUATOR

(75) Inventors: Takamichi Fujii, Kanagawa-ken (JP); Yasutoshi Hirabayashi, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 147 days.

(21) Appl. No.: 13/032,181

(22) Filed: Feb. 22, 2011

(65) Prior Publication Data

US 2011/0204750 A1 Aug. 25, 2011

(30) Foreign Application Priority Data

Feb. 23, 2010 (JP) ................................ 2010-037623

(51) Int. Cl.
*H01L 41/22* (2013.01)

(52) U.S. Cl.
USPC ........... 310/330; 310/324; 310/331; 310/332; 310/346

(58) Field of Classification Search
USPC ................. 310/312, 324, 330, 331, 332, 346
See application file for complete search history.

(56) References Cited

U.S. PATENT DOCUMENTS

| | | | |
|---|---|---|---|
| 7,633,213 B2 * | 12/2009 | Takayama et al. | 310/331 |
| 2005/0210645 A1 | 9/2005 | Xin-Shan et al. | |
| 2006/0181375 A1 | 8/2006 | Nakatani et al. | |
| 2006/0196267 A1 | 9/2006 | Takahashi et al. | |
| 2006/0202591 A1 | 9/2006 | Inaguma et al. | |
| 2008/0238257 A1 * | 10/2008 | Kawakubo et al. | 310/328 |
| 2009/0206702 A1 * | 8/2009 | Kawakubo et al. | 310/330 |
| 2009/0231395 A1 * | 9/2009 | Tsukamoto | 347/70 |
| 2011/0148255 A1 * | 6/2011 | Nihei | 310/330 |

FOREIGN PATENT DOCUMENTS

| | | |
|---|---|---|
| JP | 5-296713 A | 11/1993 |
| JP | 2003-217421 A | 7/2003 |
| JP | 2005-295786 A | 10/2005 |
| JP | 2006-210250 A | 8/2006 |
| JP | 2007-24881 A | 2/2007 |
| JP | 2008-42069 A | 2/2008 |
| JP | 2008-91167 A | 4/2008 |
| JP | 2008-218547 A | 9/2008 |

OTHER PUBLICATIONS

Japanese Office Action, dated Nov. 12, 2013, issued in Japanese Patent Application No. 2010-037623.

* cited by examiner

*Primary Examiner* — Derek Rosenau
*Assistant Examiner* — Bryan Gordon
(74) *Attorney, Agent, or Firm* — Birch, Stewart, Kolasch & Birch, LLP

(57) ABSTRACT

An actuator includes: a diaphragm having a thickness equal to or greater than 0.5 μm and equal to or less than 20 μm; a piezoelectric body layer which is provided on a first surface side of the diaphragm, and receives stress from the diaphragm; a pair of electrodes which is provided on the first surface side of the diaphragm together with the piezoelectric body layer, and is mutually opposing via the piezoelectric body layer; and a stress adjusting layer which is provided on a second surface side of the diaphragm on an opposite side to the first surface of the diaphragm, and receives stress from the diaphragm in a same direction as the stress that the piezoelectric body layer receives from the diaphragm.

14 Claims, 8 Drawing Sheets

ACTUATOR, ACTUATOR STRUCTURE AND METHOD OF MANUFACTURING ACTUATOR

BACKGROUND OF THE INVENTION

1. Field of the Invention

The present invention relates to an actuator, and more particularly, to an actuator, an actuator structure including a structure in which a piezoelectric thin layer is layered on a diaphragm and an art related to a method of manufacturing same.

2. Description of the Related Art

Japanese Patent Application Publication No. 5-296713 discloses a structure of a cantilever type displacement element formed by layering a piezoelectric film and an electrode on a substrate, wherein a stress relieving layer is provided at least one of between the layers of an electrode and a piezoelectric film and between the layers of the electrode and the substrate, in order to improve repetition durability, while preventing cracking of the piezoelectric film, peeling away of the interface between the piezoelectric film and the electrode, warping of the front end, and the like.

Japanese Patent Application Publication No. 2003-217421 proposes a structure for a micro-machine switch used for switching a high-frequency signal, wherein micro-machine switch has a cantilever beam shape where a piezoelectric film serves as a drive section, in order to achieve high responsiveness, low power consumption, high reliability and long life.

Japanese Patent Application Publication No. 2008-42069 discloses a composition for a lead zirconate titanate (PZT: General Formula Pb $(Zr_xTi_{1-x})O_3$ ($0<x<1$)) type piezoelectric layer formed by vapor phase epitaxy, in which stress is controlled by forming an orientation control layer having compressive stress on the lower electrode side of the piezoelectric body, in order to improve the crystalline orientation of the piezoelectric layer and suppress cracking.

However, the stress relieving layer disclosed in Japanese Patent Application Publication No. 5-296713 only serves to relieve stress produced at the interface between layers and cannot fully suppress warping of the cantilever section. Furthermore, with the structure of a cantilever type displacement element disclosed in Japanese Patent Application Publication No. 5-296713, the drive force (one type of stress) occurring when the piezoelectric body is driven is absorbed by the stress relieving layer, and therefore the displacement efficiency is poor, and if it is sought to increase the stress relieving effect more than is necessary, then there is a possibility that the drive force produced by the piezoelectric body is not transmitted and the cantilever section is not displaced sufficiently.

In the switch structure disclosed in Japanese Patent Application Publication No. 2003-217421, since there is a possibility of warping of the cantilever beam due to stress, then it is deduced that production yield will be poor. Furthermore, in Japanese Patent Application Publication No. 2003-217421, no specific method of manufacture is described and further modifications are required in the manufacturing process in order to achieve this switch structure in a satisfactory manner.

In the composition disclosed in Japanese Patent Application Publication No. 2008-42069, when choosing the orientation controlling layer, it is necessary to select a layer which receives compressive stress from the piezoelectric layer. For example, in the case of a composition formed by layering a lower electrode layer, a piezoelectric layer and an upper electrode layer onto a silicone (Si) substrate, the material which receives the compressive stress is generally required to have a smaller coefficient of thermal expansion than the Si. However, general ceramics and metals have a higher coefficient of thermal expansion than Si. Therefore, the materials which can be used in the orientation control layer disclosed in Japanese Patent Application Publication No. 2008-42069 are limited.

SUMMARY OF THE INVENTION

The present invention has been contrived with the foregoing circumstances in view, an object thereof being to provide an actuator and an actuator structure whereby warping of an actuator moving part, such as a cantilever structure or diaphragm structure, can be prevented, improved production yield can be achieved, high reliability and durability are achieved, and a further object being to provide a method of manufacturing such an actuator.

In order to attain an object described above, one aspect of the present invention is directed to an actuator comprising: a diaphragm having a thickness equal to or greater than 0.5 μM and equal to or less than 20 μm; a piezoelectric body layer which is provided on a first surface side of the diaphragm, and receives stress from the diaphragm; a pair of electrodes which is provided on the first surface side of the diaphragm together with the piezoelectric body layer, and is mutually opposing via the piezoelectric body layer; and a stress adjusting layer which is provided on a second surface side of the diaphragm on an opposite side to the first surface of the diaphragm, and receives stress from the diaphragm in a same direction as the stress that the piezoelectric body layer receives from the diaphragm.

If the thickness of the diaphragm is greater than 20 μm, then the amount of displacement of the movable part including the diaphragm and the piezoelectric body layer is small and driving is liable to be insufficient for an actuator. Furthermore, if the thickness of the diaphragm is a large value exceeding 20 μm, then there is little warping (bending) due to the stress in the piezoelectric body layer, and hence warping is not a significant problem. Therefore, in this aspect of the present invention, a diaphragm having a thickness equal to or greater than 0.5 μm and equal to or less than 20 μm is employed as a thickness of a diaphragm which requires a solution for the problem of "warping", while ensuring a practicable thickness which can fulfill the functions of the diaphragm in an actuator.

According to this aspect of the present invention, the stress acting on the first surface side of the diaphragm due to the piezoelectric body layer which is layered on the diaphragm balances with the stress acting on the second surface side of the diaphragm due to the stress adjusting layer which is layered on the second surface on the opposite side, and warping of the diaphragm is prevented. Consequently, production yield is improved. Furthermore, an actuator having good reliability and excellent durability is obtained.

Desirably, the stress that the piezoelectric body layer receives from the diaphragm is tensile stress which has a stress value equal to or greater than 50 MPa and equal to or less than 500 MPa.

The direction of the stress that the piezoelectric body layer receives from the diaphragm may be tensile stress or, conversely, compressive stress. For example, in the step of forming the piezoelectric body layer, if the piezoelectric body film is formed at a temperature above room temperature, then upon returning subsequently to room temperature, stress is received according to the difference in coefficient of thermal expansion between the piezoelectric body and the diaphragm. If the coefficient of thermal expansion of the piezoelectric body is greater than the coefficient of thermal expansion of the diaphragm, then the piezoelectric body layer receives a tensile stress from the diaphragm.

If the stress value that the piezoelectric body layer receives from the diaphragm is less than 50 MPa, then "warping" rarely becomes a problem. On the other hand, if the stress value exceeds 500 MPa, then not only is it difficult to correct warping by means of a stress adjusting layer, but furthermore, other problems such as cracking of the piezoelectric body layer, and the like, become more pronounced than the issue of "warping". Consequently, the present invention can be applied to especially beneficial effect when the stress value is in the range of 50 to 500 MPa.

Desirably, a coefficient of thermal expansion of the stress adjusting layer is greater than a coefficient of thermal expansion of the diaphragm, and is equal to or greater than 5 ppm/° C.

According to this aspect, it is possible to obtain a stress adjusting layer which is able to cancel out warping caused by the stress on the piezoelectric body layer side.

Desirably, the diaphragm is made of silicon (Si) or silicon dioxide ($SiO_2$) or a combination of these.

According to this aspect, by employing semiconductor manufacturing technology using a Si wafer or SOI wafer, it is possible to manufacture a fine actuator device. The coefficient of thermal expansion of Si is approximately 2.6 ppm/° C., and the coefficient of thermal expansion of $SiO_2$ is approximately 0.5 ppm/° C. On the other hand, the coefficient of thermal expansion of PZT is around 5 to 7 ppm/° C.

In order to attain an object described above, another aspect of the present invention is directed to an actuator structure comprising: any of the actuators as described above; and a structure joined to a side of the piezoelectric body of the actuator, wherein the structure has a recess section forming a space that allows a movable part of the actuator to be displaced, on a side of the piezoelectric body layer of the actuator.

In an actuator constituted by forming a piezoelectric layer sandwiched between a pair of electrodes on a first surface side of a diaphragm and forming a stress adjusting layer on a second surface side opposite to same, the diaphragm and the piezoelectric layer are displaced by applying a voltage between the pair of electrodes. An actuator forming a displacement element of this kind is often used in a state of being bonded with another structure having a recess section which ensures a displacement space for the movable part. For example, in the case of an actuator structure in which a movable part is supported by a cantilever structure, or an actuator structure where a movable part is supported by a dual-support beam structure, or an actuator structure using a diaphragm structure in which the whole periphery of a movable part is supported in a fixed fashion, then a structure having a supporting portion which fixes the fulcrum of the movable part and a recess section forming a displacement space for the movable part is bonded.

Desirably, in a state where no voltage is applied between the pair of electrodes, the piezoelectric body layer is polarized in a direction such that a side of the structure is positive and a side of the diaphragm is negative.

According to this aspect, by generating an electric field in a direction from the side of the diaphragm of the piezoelectric body layer toward the side of the structure through applying a voltage to the pair of electrodes, it is possible to perform driving so as to displace the movable part in a direction toward the structure.

Desirably, when a drive voltage is applied to the pair of electrodes, the movable part is displaced in a direction to enter inside the recess section of the structure, and of a coercive electric field on a positive field side and a coercive electric field on a negative field side in polarization (Pr)-electric field (E) hysteresis characteristics, if a coercive electric field in a field direction during driving by application of the drive voltage is taken to be $Ec\_a$, and a coercive electric field in a field direction during driving by application of a voltage in an opposite direction to the drive voltage is taken to be $Ec\_b$, then $|Ec\_b|>|Ec\_a|$ is satisfied.

According to an aspect which employs a piezoelectric body layer in which the polarization (Pr)-field (E) hysteresis characteristics are biased with respect to the field in this way, by applying a voltage between the pair of electrodes in the opposite direction to the drive voltage, the movable part is displaced in a direction away from (separating from) the recess section of the structure, and therefore sticking of the movable part to the structure can be prevented. If piezoelectric driving is performed by application of a voltage in the opposite direction, from a state where the movable part is displaced toward the base substrate side, then in addition to the force (spring force) which seeks to return the diaphragm to its original position (reference position), a drive force is also applied in the separating direction by means of piezoelectric driving, and therefore it is possible to obtain a strong separating force.

Desirably, $|Ec\_b|>2|Ec\_a|$, and more desirably, $|Ec\_b|>5|Ec\_a|$. The greater the difference between $|Ec\_b|$ and $|Ec\_a|$ (the greater the bias), the more desirable from the viewpoint of raising the voltage that can be applied when driving in the separating direction (when driving to prevent sticking.)

Desirably, the movable part is supported by a cantilever structure.

The application of the present invention is especially beneficial in the case of a cantilever structure, because warping is more liable to occur than in a dual-support structure or diaphragm structure.

In order to attain an object described above, another aspect of the present invention is directed to a method of manufacturing an actuator, comprising: a film forming step of forming a first electrode layer, a piezoelectric body layer and a second electrode layer on a first surface of a first substrate; a thin layer forming step of removing a portion of the first substrate from a surface on a side opposite to the first surface of the first substrate where the piezoelectric body layer is formed in such a manner that a remaining portion of the first substrate forms a diaphragm having a thickness equal to or greater than 5 µm and equal to or less than 20 µm; and a stress adjusting layer forming step of forming a stress adjusting layer which receives stress from the diaphragm in a same direction as stress that the piezoelectric body layer receives from the diaphragm, on a second surface on an opposite side to the first surface of the diaphragm where the piezoelectric body layer is formed.

According to this aspect of the invention, it is possible to prevent warping of the movable part of an actuator constituted by a structure of layered thin films, and therefore improvement in production yield can be achieved. Furthermore, an actuator having good reliability and excellent durability is obtained. By means of the method according to this aspect of the invention, it is possible to obtain the actuator and the actuator structures as described above.

Desirably, the piezoelectric body layer is formed at a film formation temperature equal to or greater than 300° C. and equal to or less than 700° C., and has a film thickness equal to or greater than 0.5 µm and equal to or less than 10 µm.

According to this aspect, since corresponding stress is produced due to the difference in coefficient of thermal expansion between the diaphragm and the piezoelectric body layer, a marked effect in preventing warping is observed due to the stress adjusting action created by the stress adjusting layer of this aspect of the invention.

Desirably, the method of manufacturing an actuator, comprises a structure bonding step of bonding a structure having a second substrate to a first surface side of the first substrate where the piezoelectric body layer is formed, wherein the stress adjusting layer is formed after the structure bonding step.

It is possible to obtain an actuator structure by bonding another structure which supports the actuator, to the actuator (laminated thin films) in which a piezoelectric body layer sandwiched between a pair of electrodes is formed on a first surface side of a diaphragm and a stress adjusting layer is formed on a second surface opposite same.

Desirably, the thin layer forming step is carried out in a state where the structure has been bonded to the first substrate, whereupon the stress adjusting layer is formed.

According to this aspect, the substrate can be handled easily in the thin layer forming step and the step of forming the stress adjusting layer.

Desirably, the method of manufacturing an actuator, comprises a movable part shape separating step of removing a portion of the piezoelectric body layer and the diaphragm to separate a periphery of a shape that is to form a movable part of an actuator having a cantilever structure, after the stress adjusting layer has been formed.

According to this aspect, since the shape of the movable part having a cantilever structure is cut out in a state where warping has been corrected by the addition of a stress adjusting layer, then it is possible to prevent warping of the cantilever section even after it has been cut out.

According to the present invention, it is possible to prevent warping of a movable part of an actuator including a diaphragm and a piezoelectric layer, and improvement in production yield can be achieved. By this means, it is possible to provide an actuator and an actuator structure having good reliability and durability.

BRIEF DESCRIPTION OF THE DRAWINGS

A preferred embodiment of this invention as well as other objects and benefits thereof, will be explained in the following with reference to the accompanying drawings, in which like reference characters designate the same or similar parts throughout the figures and wherein.

DESCRIPTION OF THE PREFERRED EMBODIMENTS

Here, an rf-MEMS (Micro Electro Mechanical System) switch having a cantilever structure used in a high-frequency circuit is described by way of an example, but the range of application of the present invention is not limited to this.
Example of Manufacturing Process of rf-MEMS Switch FIGS. 1A to 1J are step diagrams showing a manufacturing process for an rf-MEMS switch employing an actuator relating to an embodiment of the present invention.
(Step 1)

Figure 1A:
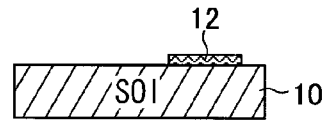
FIGS. 1A to 1J are step diagrams showing a manufacturing process of an rf-MEMS switch employing an actuator relating to an embodiment of the present invention.

An electrode 12 for a high-frequency (rf) signal line was patterned on an SOI (silicon on insulator) wafer 10 (active layer 5 μm) which was used as a substrate (FIG. 1A). It is also possible to use a normal silicon (Si) wafer instead of the SOI wafer.
(Step 2)

Figure 1B:
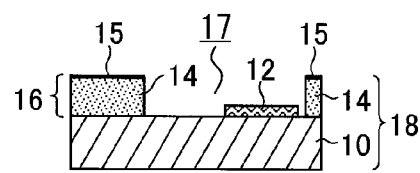

Thereupon, photoresist (for example, product name: SU-8) 14 was formed to a thickness of 5 μm on the SOI wafer 10, and Au—Sn 15 was formed thereon, and then patterning of this was carried out to form a column 16 (FIG. 1B). The wafer (structure) obtained in this step 2 above was taken as a "lower wafer" 18.
(Step 3)

Figure 1C:
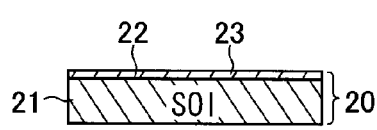

Meanwhile, separately from steps 1 and 2 described above, an SOI wafer 20 was prepared as a substrate, as shown in FIG. 1C. The SOI wafer 20 had a structure in which an active layer (Si layer) 23 was laminated via a thermal oxide film ($SiO_2$) 22 on the silicon layer 21. In the case of the present embodiment, the thickness of the active layer 23 was 5 μm. In other words, the SOI wafer 20 with the thermal oxide film 22 and the active layer 23 with a thickness of 5 μm was prepared as a substrate.
(Step 4)

Figure 1D:
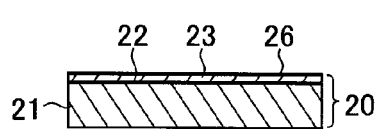

TiW (film thickness 50 nm) and Ir (film thickness 150 nm) were formed in a laminated structure as a lower electrode 26 of the piezoelectric body (PZT), onto the active layer 23 of the SOI wafer 20 (FIG. 1D).
(Step 5)

Figure 1E:
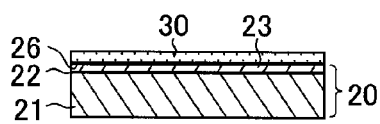

Thereupon, a piezoelectric (PZT) film 30 was formed to a thickness of 4 μm at 500° C. on the lower electrode 26 by sputtering (FIG. 1E). The piezoelectric characteristics of this piezoelectric film 30 are described in detail below. The state of polarization of the piezoelectric film 30 was such that the upper side in FIG. 1E (the TiW/Au electrode side) was positively polarized and the lower side (TiW/Ir electrode side) was negatively polarized. If the direction from the positive to negative of polarization charge is defined as the "polarization direction", then the polarization direction here was "downward".

Desirably, the film formation temperature of the piezoelectric film 30 is in the range of 300° C. to 700° C., and the film thickness of the piezoelectric film 30 is desirably 0.5 μm to 10 μm. By adopting these conditions, it is possible to obtain a piezoelectric film 30 which satisfies a stress value of 50 MPa to 500 MPa.
(Step 6)

Figure 1F:
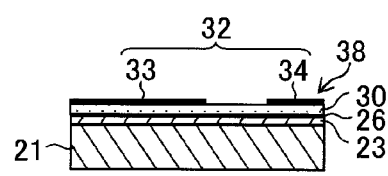

Next, TiW (film thickness 50 nm) and Au (film thickness 150 nm) were superimposed in layers as an electrode 32 on top of the piezoelectric film 30, and by patterning, a portion thereof was formed into an electrode 33 for PZT driving and a portion thereof was formed into an electrode 34 for an rf signal wire (FIG. 1F). The wafer structure obtained by this step 6 is taken as an "upper wafer" 38. The procedure for manufacturing the upper wafer 38 (steps 3 to 6) and the procedure for manufacturing the lower wafer 18 (steps 1 to 2) can be carried out independently, and therefore the upper wafer 38 and the lower wafer 18 may be manufactured in any order.

(Step 7)

Figure 1G:
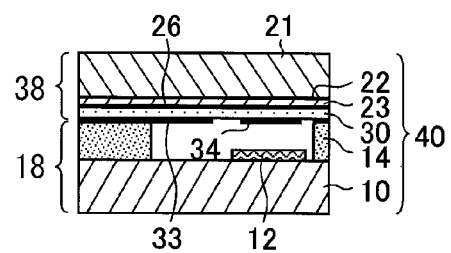

Thereupon, the lower wafer 18 and the upper wafer 38 were mutually superimposed and bonded together as shown in FIG. 1G, thereby forming one wafer 40 (this corresponds to the "structure bonding step").

In this situation, the upper wafer 38 was turned upside-down from the state in FIG. 1F, and with the electrodes 32 (33, 34) facing downwards (toward the lower wafer 18), the upper wafer 38 was bonded to the lower wafer 18. In other words, in the bonded state in FIG. 1G, the electrode having reference numeral 33 which was disposed on the lower face of the piezoelectric film 30 became the lower electrode and the electrode having reference numeral 26 which was disposed on the upper face of the piezoelectric film 30 became the upper electrode. In this case, the direction of polarization of the piezoelectric film 30 was "upward".

(Step 8)

Figure 1H:
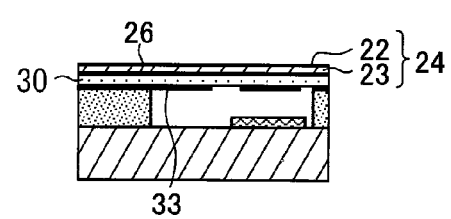

Next, the Si layer 21 of the upper wafer 38 (which corresponds to a sacrificial layer) was removed by wet etching, to leave only the thermal oxide film 22 and the active layer 23 (FIG. 1H). A diaphragm 24 was constituted by this remaining thermal oxide film 22 and active layer 23 (this corresponds to a "thin layer forming step"). It is also possible to adopt a mode where the thermal oxide film 22 is removed to leave only the active layer 23, which is employed as a diaphragm.

(Step 9)

Figure 1I:
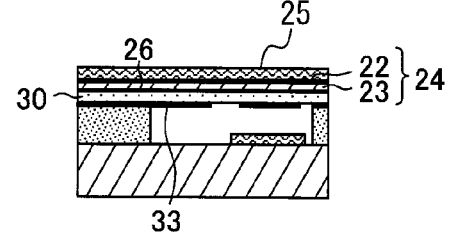

Next, $TiO_2$ was formed by sputtering to a thickness of 500 nm at 200° C. as a stress adjusting layer 25, on the diaphragm 24 which was disposed on the lower wafer 18 (FIG. 1I, this corresponds to the "stress adjusting layer forming step"). Here, $TiO_2$ was given as an example, but the material of the stress adjusting layer is not limited in particular. Suitable conditions for the stress adjusting layer are that it should have a coefficient of thermal expansion which is greater than the coefficient of thermal expansion of Si (2.6 ppm/° C.) and that it should be formed at a temperature higher than room temperature.

The coefficient of thermal expansion of $TiO_2$ was 9.2 ppm/° C., and therefore when the temperature returns to the room temperature after film formation, then tensile stress occurred in the $TiO_2$ film.

The material, film thickness and film forming conditions of the stress adjusting layer 25 were selected in such a manner that the tensile stress produced in the piezoelectric film 30 and the tensile stress produced in the stress adjusting layer ($TiO_2$ film) balanced with each other.

The coefficient of thermal expansion of the stress adjusting layer 25 is desirably greater than the coefficient of thermal expansion (2.6 ppm/° C.) of the silicon (Si) which constitutes the diaphragm 24. Internal stress and stress due to the coefficient of thermal expansion are included in causes of occurrence of stress in the film, but due to the thermal history during the device forming process and other factors, the internal stress value becomes small. Therefore, the stress caused by difference of the coefficient of thermal expansion can be regarded as the predominant factor.

The stress produced in the stress adjusting layer 25 was determined by the difference in coefficient of thermal expansion with respect to the diaphragm material, the film forming temperature and the film thickness. The greater the difference in coefficient of thermal expansion with respect to the diaphragm material, the greater the stress, and furthermore, the higher the film formation temperature, the greater the stress when the material returns to room temperature. Furthermore, the thicker the film thickness, the stress also becomes greater. More specifically, the larger the difference in the coefficient of thermal expansion with respect to the diaphragm, the stress can be adjusted by the stress adjusting layer 25 having a thinner film thickness at a lower substrate temperature (film formation temperature). Therefore, desirably, the coefficient of thermal expansion of the stress adjusting layer 25 is 5 ppm/° C. or above. More desirably, the coefficient of thermal expansion is 7 ppm/° C. or higher, and more desirably 10 ppm/° C. or higher. Film formation was carried out while adjusting these parameters in such a manner that the stresses on both surfaces of the diaphragm are balanced.

(Step 10)

Figure 1J:
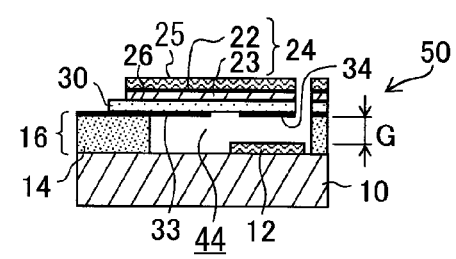

Next, a portion of the stress adjusting layer 25, the piezoelectric film 30 and the diaphragm 24 was removed by dry etching (so as to make a through-hole by the removal), thereby separating the periphery of a shape that was to form a moving part of a cantilever structure (FIG. 1J, this corresponds to the "movable part shape separating step"). In this, there was virtually no warping of the cantilever portion, which was flat. Warping of the cantilever portion was prevented due to the balancing of the stress of the piezoelectric film 30 which was provided on one surface of the diaphragm 24 (the lower side in FIG. 1I) and the stress of the stress adjusting layer 25 which was provided on the opposite surface (the upper surface of the diaphragm 24 in FIG. 1I).

The column 16 made from the resist 14 functioned as a support base providing a cantilever support for the movable part constituted by the piezoelectric film 30 and the diaphragm 24, as well as functioning as a wall member (spacer member) which formed a space (cavity) 44 ensuring a gap G between the electrodes (12, 34). The distance (gap G) between the electrodes (12, 34) for the switch contact is 20 μm or less, desirably, 10 μm or less, and more desirably, 5 μm or less.

In this way, an rf-MEMS switch 50 was manufactured in which the movable electrode indicated by reference numeral 34 opposed the fixed electrode indicated by reference numeral 12, via the space (gap) 44.

(Step 11)

Finally, the resist (not illustrated) adhering onto the active layer 23 in step 10 was removed by a remover and then washing was carried out. The process of cleaning, and the like, is not limited to this step 10, and other steps may be carried out as necessary, but description thereof is omitted here.

The rf-MEMS switch 50 manufactured by the procedure described above carried out contacting and separating the movable electrode 34 with respect to the fixed electrode 12 by means of piezoelectric driving so as to perform an on/off switching operation.

The lower wafer indicated by the reference numeral 18 in FIG. 1B corresponds to the "structure", and the recess section 17 which is sunken lower than the portion (projecting section) of the column 16 on the wafer 10 corresponds to the "recess section" which forms a displacement space (space 44) for the cantilever section.

In implementing the present invention, the steps for manufacturing a switch (manufacturing method) and the structure of the switch are not limited to the embodiment described above.

Comparative Example

For the purpose of comparison, a switch without the stress adjusting layer 25 was manufactured by omitting step 9.

FIGS. 2A to 2I are manufacturing processes for this switch. In FIGS. 2A to 2I, elements which are the same as or similar to the composition shown in FIGS. 1A to 1J are labelled with the same reference numerals and further explanation thereof is omitted here.

Figure 2A:
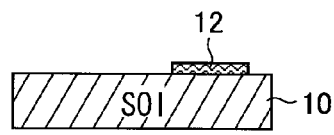
FIGS. 2A to 2I are step diagrams showing a manufacturing process for an rf-MEMS switch according to a comparative example.
Figure 2B:
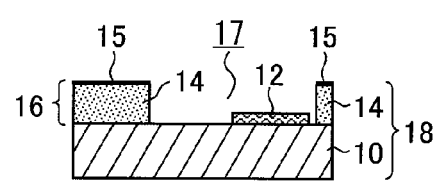
Figure 2C:
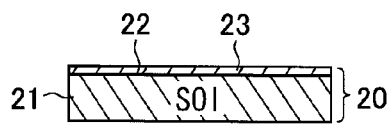
Figure 2D:
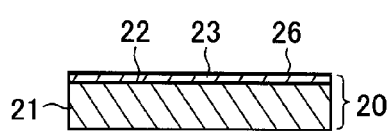
Figure 2E:
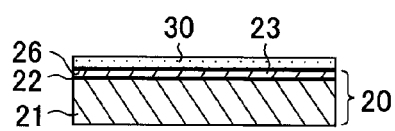
Figure 2F:
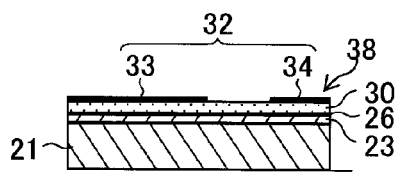
Figure 2G:
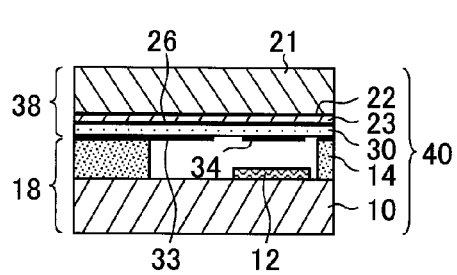
Figure 2H:
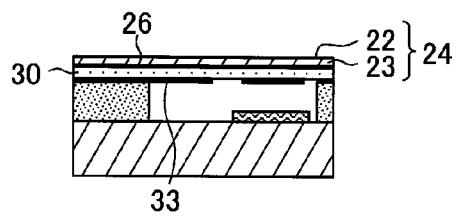
Figure 2I:
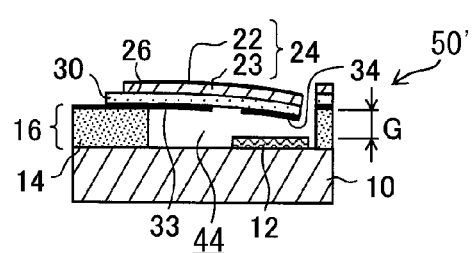

As shown in FIGS. 2A to 2I, in the case of a composition which omits a stress adjusting layer, the cantilever section was warped downwards due to the stress of the piezoelectric film 30 (see FIG. 2I). Therefore, the switch 50' shown in FIG. 2I had poor reliability compared to the rf-MEMS switch 50 relating to the embodiment of the present invention illustrated in FIG. 1J.

Relationship Between Stress, Coefficient of Thermal Expansion and Film Forming Temperature In general, assuming that there is no warping, and taking the coefficient of thermal expansion of the substrate to be as [1/° C.], taking the coefficient of thermal expansion of the film formed on the substrate to be of [1/° C.], taking the film forming temperature to be Tg [° C.], and taking room temperature to be Ta [° C.], then the thermal stress $\sigma$ [N/m$^2$] upon returning to room temperature after film formation which the film receive is expressed by:

$$\sigma = E \times (\alpha s - \alpha f) \times (Tg - Ta)$$

Here, E is the Young's modulus of the film [Pa=N/m$^2$]. The symbol $\sigma$ is positive when the film receives a compressive stress. The larger the Young's modulus (coefficient of longitudinal elasticity) of the film (i.e., the harder the film), the greater the stress. More specifically, if the stress in the piezoelectric film 30 side is large, then it is not possible to suppress warping of the device unless the stress of the stress adjusting layer 25 is also made large accordingly.

In implementing the present embodiment, the stress value of the piezoelectric layer (the piezoelectric film 30) and the stress value of the stress adjusting layer 25 are made approximately equal; the stress value of the stress adjusting layer 25 is desirably 0.1 to 10 times, more desirably, 0.3 times to 5 times, and even more desirably, approximately 0.6 times to 2 times the stress value of the piezoelectric layer.

Although this model does not incorporate a parameter for film thickness, in practice the film thickness also has an effect, it being possible to generate a larger force when the film thickness is larger.

In implementing the present embodiment, desirably, the thickness of the stress adjusting layer 25 should be made as small as possible from the viewpoints of film formation time and variation in the thickness of the diaphragm 24, and therefore it is desirable that the stress adjusting layer 25 should be capable of generating a large stress even if the film thickness is small. Therefore, the material used for the stress adjusting layer 25 desirably has a large Young's modulus and can be formed as a film at the highest possible temperature; compared to organic materials, inorganic materials are desirable as the material since they have a higher Young's modulus and can be formed as a film at high temperature.

Desirable candidates for such inorganic materials are metals, metal oxides and metal nitrides, and composites of these. Here, a metal material is described, but this is taken to include intermediate materials that are between metals and non-metals, such as C, Si, Sb and Bi.

Material of the Piezoelectric Body

Here, the piezoelectric material used in an embodiment of the present invention will be described. The piezoelectric body used in the present embodiment is based on lead titanate zirconate (Pb(Zr,Ti)O$_3$, commonly known as "PZT"). In PZT, both Zr and Ti are tetravalent ions, and all concentration ratios for Ti:Zr from PbTiO$_3$ to PbZrO$_3$ can be adopted. Of these, particularly favourable piezoelectric characteristics are achieved with a composition having a Zr:Ti ratio of 52:48 or 53:47, which are compositions midway between a square crystal of a PbTiO$_3$ crystal system and a rhombohedron of a PbZrO$_3$ crystal system, and these characteristics are used in a piezoelectric body for an actuator. This composition is called an MPB composition.

Modified PZT is formed by taking true PZT which does not have any added dopant and improving the piezoelectric characteristics by adding a trace amount of ions having higher valence than tetravalent, such as Nb$^{5+}$, for instance. The PZT used in the present embodiment can be doped with approximately 10% or more of Nb, thereby obtaining high-performance PZT (modified PZT). For example, high piezoelectric characteristics of d31=200 to 300 pm/V are obtained.

Figure 3:
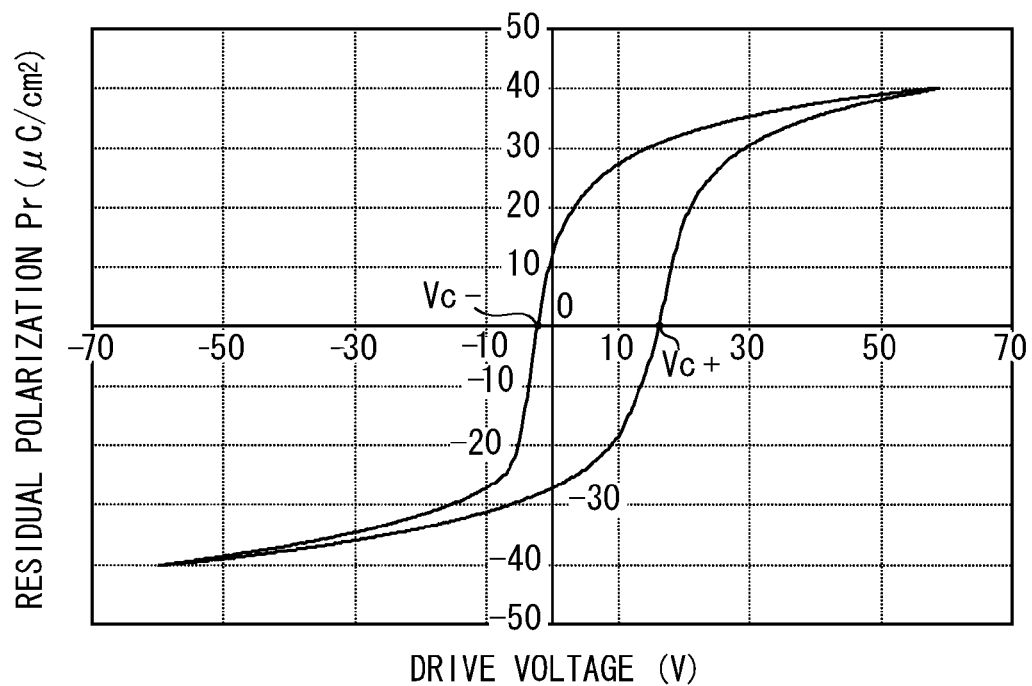
FIG. 3 is a diagram showing Pr-E hysteresis characteristics of a piezoelectric film (film thickness 4 μm) used in an embodiment of the present invention.

FIG. 3 shows the Pr-E hysteresis characteristics of a piezoelectric film (film thickness 4 μm) used in the present embodiment. Here, a modified PZT film doped with Nb was used. The horizontal axis in FIG. 3 represents the "drive voltage" (unit: Volts [V]), and the electric field can be obtained by dividing the voltage by the film thickness. The coercive electric field is a point on the Pr-E hysteresis characteristic curve where the residual polarization becomes zero, and the coercive electric fields of the piezoelectric film in the present embodiment were approximately 35 kV/cm on the positive field side (Ec+) and approximately 7.5 kV/cm on the negative field side (Ec−). In FIG. 3, Vc+ is the voltage corresponding to the coercive electric field (Ec+) on the positive field side (the product of the coercive electric field Ec+ and the film thickness) and Vc− is the voltage corresponding to the coercive electric field (Ec−) on the negative field side (the product of the coercive electric field Ec− and the film thickness).

Figure 4:
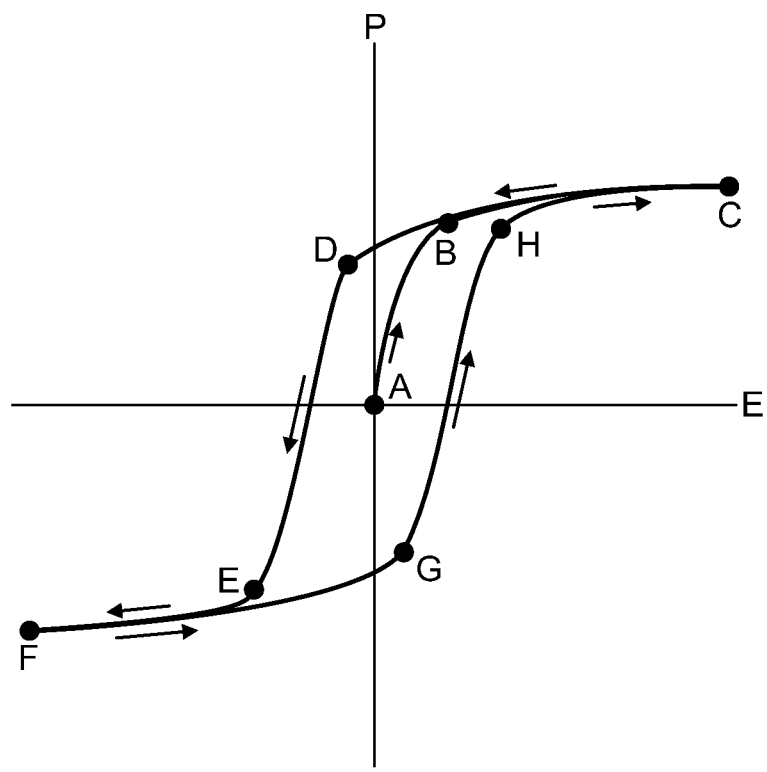
FIG. 4 is a diagram showing Pr-E hysteresis characteristics in a related-art piezoelectric body (PZT type)
Figure 5:
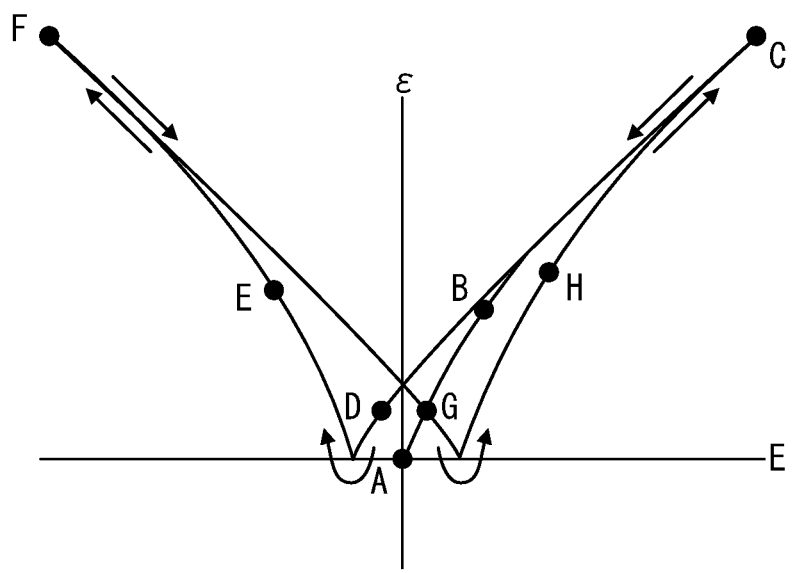
FIG. 5 is a diagram showing a relationship between distortion (electrostrictive strain) and applied electric field in a related-art piezoelectric body (PZT type)

For the purpose of comparison, FIG. 4 and FIG. 5 show the characteristics of a general piezoelectric body according to the related art. FIG. 4 and FIG. 5 are cited from FIG. 4 and FIG. 5 of Japanese Patent Application Publication No. 2008-91167. FIG. 4 is a diagram showing the relationship between the electric field E applied to a ferroelectric film and the polarization Pr of the film, which is known as the Pr-E hysteresis curve. FIG. 5 is a diagram showing the relationship between the distortion $\epsilon$ produced in a ferroelectric body and the applied electric field E. As shown in FIG. 4, the Pr-E hysteresis of a conventional general piezoelectric body is substantially symmetrical with respect to the y axis which indicates the polarization value, and the coercive electric field Ec1 on the negative field side and the coercive electric field Ec2 on the positive field side are substantially equal (|Ec1|≈Ec2).

On the other hand, the PZTN film used in the present embodiment was formed by vapor phase deposition, such as sputtering, and the Pr-E hysteresis of the film was biased toward the positive field side, in other words, was asymmetrical with respect to the y axis, as shown in FIG. 3. The absolute value of the coercive electric field Ec− on the negative field side (which corresponds to "Ec_a") and the absolute value of the coercive electric field Ec+ on the positive field side (which corresponds to "Ec_b") were mutually different, and had the relationship: |Ec+|>|Ec−|. With a piezoelectric film having asymmetrical Pr-E hysteresis biased toward the positive field side in this way, when a positive electric field was applied, it was difficult to achieve polarization because the coercive electric field Ec+ was large, and when a negative electric field was applied, polarization can be achieved readily because the absolute value of the coercive electric field Ec− was small.

In other words, it is possible to obtain a large piezoelectric capacity by driving by applying an electric field of the polarity on the side having the lower absolute value of the coercive electric field (in this case, negative driving).

The example described in the present embodiment is a piezoelectric body having Pr-E hysteresis biased toward the positive field side, but it is possible to obtain similar action and beneficial effects in a piezoelectric body having Pr-E hysteresis biased toward the negative field side, except that the signs of the values will be different.

Figure 6:
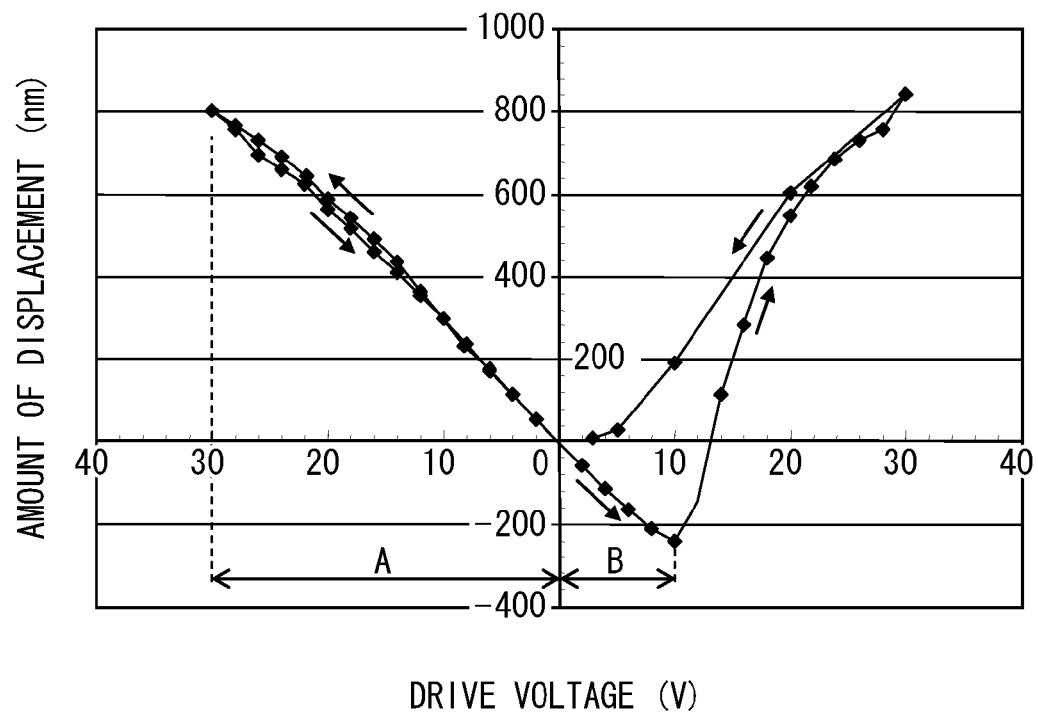
FIG. 6 is a diagram showing a relationship between drive voltage and displacement (electric field-displacement hysteresis characteristics) when a piezoelectric actuator equipped with a piezoelectric film having the characteristics in FIG. 3 is driven.

FIG. 6 is a diagram showing the relationship between the drive voltage and the displacement upon driving a piezoelectric actuator including a piezoelectric film having the Pr-E hysteresis characteristics shown in FIG. 3. In FIG. 6, the "field-displacement hysteresis characteristics" obtained by driving a piezoelectric actuator (see FIG. 7) manufactured in the manufacturing example described below are shown. Here, the positive and negative sign of the drive voltage is defined by taking the lower electrode (the Ti/Ir electrode layer in FIG. 7) as the reference potential (ground). The state of polarization of the piezoelectric film in the piezoelectric actuator when not being driven is indicated by "+" on the upper electrode side and by "−" on the lower electrode side (the polarization vector is in the upward direction). Moreover, with regard to the amount of displacement, an amount of displacement of the diaphragm (the Si layer with 5 µm thick and the $SiO_2$ layer with 0.3 µm thick in FIG. 7) in the downward protruding direction is defined as displacement in the "+ direction" and an amount of displacement of the diaphragm in the upward protruding direction is defined as displacement in the "− direction".

Looking in particular at a case where a negative voltage was applied as a drive voltage, as the absolute value of the negative voltage increases from 0V (the negative field side on the left-hand side in FIG. 6), the amount of displacement progressively increased in a substantially linear relationship (directly proportional relationship) in accordance with the increase in the absolute value of the applied voltage. Here, the amount of displacement of the diaphragm in the downward protruding direction is taken as an amount of displacement in the "+ direction". Furthermore, conversely, as the absolute value of the negative voltage applied became gradually smaller, the amount of displacement progressively declined in a directly proportional relationship, which is similar to the above, in accordance with the decrease in the absolute value of the applied voltage. As shown in the drawing, there was virtually no hysteresis on the negative field side, and linearity was high (the region indicated by reference numeral A in FIG. 6). In FIG. 6, the error in linearity due to hysteresis was 1% or less.

Moreover, even if the voltage passed beyond 0V from the negative voltage and switches to a positive voltage, there was a linear region over a certain range (the region indicated by reference numeral B in FIG. 6). In other words, on the positive field side, in the drive voltage range of 0V to approximately 10V, an amount of displacement in the opposite direction was obtained in substantially direct proportion to the magnitude of the applied voltage (electric field). In this way, there was a linear region in which displacement in the opposite direction (the upwardly protruding direction) was obtained when a positive voltage was applied.

The linear region on the negative field side (reference symbol A in FIG. 6) which is described above and the linear region on the positive field side (reference symbol B in FIG. 6) were continuous with each other, and hence a linear region (a range of region A plus region B) was formed in which a substantially direct proportional relationship was obtained in a continuous range spanning both the negative voltage side and the positive voltage side. Since there was a linear region (region indicated by reference numeral B) on the positive field side which was continuous from the linear region (reference numeral A) on the negative field in this way, the piezoelectric actuator of the present embodiment was capable of driving which caused displacement in an opposite direction (+ direction) due to application of voltage of the opposite sign.

Figure 7:
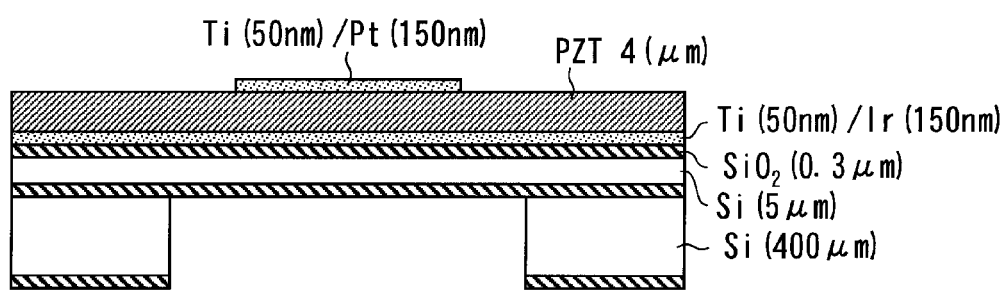
FIG. 7 is a schematic drawing of a piezoelectric actuator used for investigating the piezoelectric characteristics in FIG. 6.

Example of Manufacture of Piezoelectric Actuator in FIG. 7

Here, a method of manufacturing a piezoelectric actuator (FIG. 7) used for investigating the piezoelectric characteristics shown in FIG. 3 and FIG. 6 will be described. First, a substrate with electrodes was prepared by successively layering a 150 nm-thick Ir lower electrode via a Ti adhesive layer, by sputtering, onto an SOI (Silicon On Insulator) substrate in which a diaphragm structure was formed. Thereupon, a Nb-doped PZT film (PZTN film) was formed to a thickness of 4 microns using a $Pb_{1.3}Zr_{0.43}Ti_{0.44}Nb_{0.13}O_3$ sintered body as a target, in a mixed $Ar/O_2$ atmosphere ($O_2$ volume fraction of 1.0%) at vacuum pressure (degree of vacuum) 0.5 Pa, film forming temperature 525° C., input power 500 W, and substrate/target distance 60 mm.

In this case, the film was deposited with the substrate in a floating state and an earth provided at a position distant from the substrate that was not located between the target and the substrate. The composition of the film thus obtained was analyzed by XRF and found to be $Pb_{1.03}Zr_{0.43}Ti_{0.44}Nb_{0.13}O_3$.

Thereupon, an upper electrode of Pt was formed by sputtering via a Ti adhesive layer on the Nb-PZT film, and was patterned by a lift-off method to create a piezoelectric actuator (the thickness of each layer is shown in FIG. 7).

FIG. 3 shows the results of measuring the bipolar polarization-field characteristics (Pr-E hysteresis characteristics) of the piezoelectric actuator thus obtained. As shown in FIG. 3, the obtained Pr-E hysteresis characteristics are asymmetrical with respect to the y axis indicating the polarization and are biased toward the positive field side, and the bias rate was 76%. In this case, the coercive electric field was 41.6 kV/cm in the positive direction and 5.8 kV/cm in the negative direction.

Thereupon, the bipolar field-displacement characteristics of the piezoelectric actuator thus created were measured, and the hysteresis shown in FIG. 6 was obtained. As shown in FIG. 6, the Nb-PZT film was confirmed to have high linearity on the negative field side, and furthermore, was confirmed to have high linearity even at voltages below the coercive field on the positive side.

Operation of rf-MEMS Switch

Figure 8:
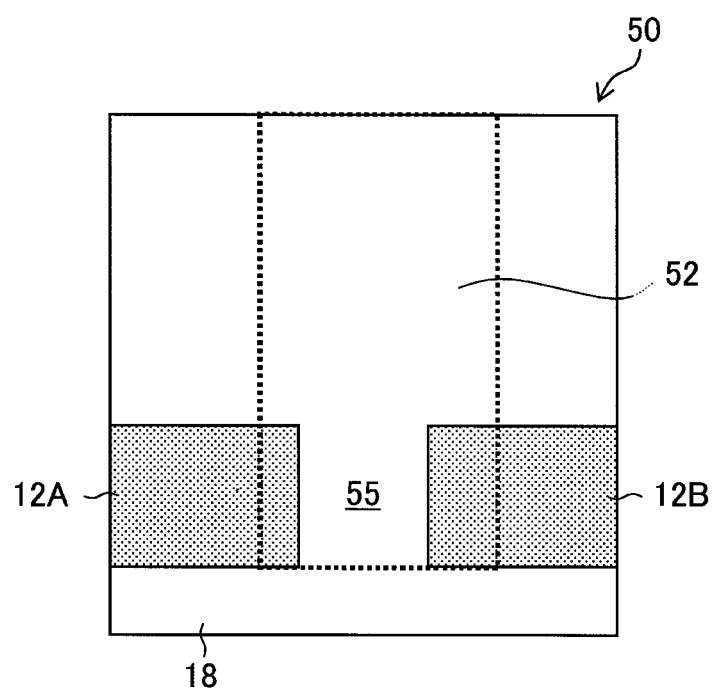
FIG. 8 is a plan diagram of an rf-MEMS switch manufactured by the manufacturing process in FIGS. 1A to 1J, as viewed from above.

FIG. 8 is a plan diagram of an rf-MEMS switch 50 according to an embodiment of the present invention which is manufactured by the manufacturing processes described in FIGS. 1A to 1J, as viewed from above. The portion indicated by the dotted line and labeled with reference numeral 52 in FIG. 8 is a cantilever portion (corresponding to a "movable part") which is displaced by piezoelectric driving. An electrode (not shown in FIG. 8; indicated by reference numeral 34 in FIGS. 1F, 1G and 1J, called "movable electrode" below) is provided below the cantilever 52.

Furthermore, signal electrodes 12A and 12B are disposed via a prescribed insulating gap 55 on top of a lower wafer 18 which opposes the cantilever 52. The electrodes 12A and 12B are signal lines which pass a high-frequency (RF) signal (hereinafter, these lines are called "rf signal lines"), and by driving the cantilever 52, it is possible to switch between coupling (on) and separation (off) of the signal lines (electrodes 12A and 12B).

More specifically, if the cantilever 52 is raised upward, then the movable electrode 34 separates form the electrodes 12A and 12B, the connection between the electrodes 12A and 12B is released (the contact is opened), and the switch assumes an "off" (non-conducting) state. On the other hand, when the cantilever 52 is moved downward and the movable electrode 34 makes contact with the electrodes 12A and 12B, then the electrodes are connected together and the switch assumes an "on" (conducting) state.

This rf-MEMS switch 50 was driven by a combination of the applied voltages shown in Table 1. Here, of the electrodes which drive the piezoelectric body (PZT), the Ir electrode (reference numeral 26) on the side of the diaphragm 24 in FIG. 1J is called the "upper electrode", and the Au electrode (reference numeral 33) on the side which faces the rf signal lines (12A and 12B) is called the "lower electrode". In the case of the switch structure shown in FIG. 1J, when the piezoelectric film 30 is compressed in the d31 direction, the switch turns on, and when the piezoelectric film 30 is stretched in the d31 direction, the switch acts so as to move away from the electrode 12.

TABLE 1

|  |  | Upper Electrode | | |
| --- | --- | --- | --- | --- |
|  |  | Positive | Earthed | Negative |
| Lower Electrode | Positive | — | Prevents sticking (up to 80% of coercive electric field) | Prevents sticking (up to 80% of coercive electric field) |
|  | Earthed | ON | — | Prevents sticking (up to 80% of coercive electric field) |
|  | Negative | ON | ON | — |

As shown in Table 1, if the lower electrode is earthed and a positive voltage is applied to the upper electrode, then the cantilever 52 is displaced downward and the switch turns on. Furthermore, if a negative voltage is applied to the upper electrode in a state where the lower electrode is earthed, then the cantilever 52 is displaced in the upward direction. In this case, the value of the negative voltage applied to the upper electrode is set to a value such that the electric field in the piezoelectric film becomes equal to or lower than the value of the coercive electric field (Ec+), and desirably is set to a voltage value which produces an electric field of 80% or less of the coercive electric field (Ec+). The driving operation performed by this application of a negative voltage is an operation of moving the cantilever 52 in a direction away from the rf signal lines (electrodes 12A and 12B), and thus provides an effect of preventing sticking. Drive modes which are described as "Prevents sticking" in Table 1 were modes where upward movement of the cantilever was confirmed by a laser Doppler displacement meter. Furthermore, it was also confirmed that the respective operations are satisfactory.

The mode of applying a drive voltage is not limited to that described above. It is possible to perform similar driving by means of a combination of electric potentials which can achieve an applied electric field similar to that described above. For example, the following kinds of mode are also possible. More specifically, if the upper electrode is earthed and a negative voltage is applied to the lower electrode, then the cantilever 52 is displaced in the downward direction and the switch switches on. Furthermore, if a positive voltage is applied to the lower electrode with the upper electrode in an earthed state, then the cantilever 52 is displaced in the upward direction. In this case, the value of the positive voltage applied to the lower electrode is set to a value such that the electric field in the piezoelectric film becomes not greater than the value of the coercive electric field (Ec+), and desirably is set to a voltage value which produces an electric field of 80% or less of the coercive electric field (Ec+). The driving operation performed by this application of a positive voltage is an operation of moving the cantilever 52 in a direction away from the rf signal lines, and thus provides an effect of preventing sticking.

Apart from this, by applying a negative voltage to the lower electrode and a positive voltage to the upper electrode, the cantilever 52 is displaced in the downward direction and the switch switches on. Conversely, if a positive voltage is applied to the lower electrode and a negative voltage is applied to the upper electrode, then the cantilever 52 is displaced in the upward direction and sticking can be prevented. In this case, the potential difference between the electrodes is set to a value such that the electric field in the piezoelectric film becomes not greater than the value of the coercive electric field (Ec+), and desirably is set to a potential difference which produces an electric field of 80% or less of the coercive electric field (Ec+).

As described above, the method of driving the piezoelectric film may employ the various combinations shown in Table 1. It is possible to use any of the combinations by selecting an appropriate drive circuit.

In a plurality of rf-MEMS switches manufactured by the manufacturing processes shown in FIGS. 1A to 1J, a portion of the devices had an initial state where the rf signal line was switched on, and there were also devices where the cantilever in the PZT portion was adhering to the lower wafer.

Liquid remaining in the device after the wet etching step and cleaning step can be a cause of sticking. Residual liquid in the device of this kind is one cause of the occurrence of sticking in some devices.

When the piezoelectric bodies of the devices experiencing such adherence were driven by a voltage combination having a "prevents sticking" effect in Table 1, this adherence (sticking) was resolved. In the case of the piezoelectric film according to the present embodiment, a voltage of approximately 7 V (70% of the coercive electric field) was applied. After resolving sticking in this way, the devices could be driven satisfactorily.

By carrying out driving for preventing sticking in the devices, during inspection of the devices, subsequent occurrence of sticking was prevented. In this way, sticking can be resolved in pre-shipment inspection and normal (shippable) elements can be achieved. This, in combination with the warping prevention effect of the stress adjusting layer 25, makes it possible to improve production yield In a case where devices free of sticking are obtained by carrying out a device inspection step, it can be envisaged that sticking may occur due to the rf signal lines remaining on permanently for some reason when the devices are actually driven at a subsequent time. In such cases, it is possible to separate the sticking by applying a voltage having a sticking prevention effect as described above (in the present embodiment, a voltage of approximately 7 V) to a device which has become stuck.

The embodiment is described above in relation to a unimorph type of actuator which causes a diaphragm to bend by means of distortion of a piezoelectric body in the d31 direction, and desirably the piezoelectric constant d31 (pm/V) of the piezoelectric body is high. Desirably, the piezoelectric constant is 100 pm/V or higher, and more desirably 200 pm/V or higher. This is because if the piezoelectric constant is 100 pm/V or lower, then there is a possibility that the force for preventing sticking according to an embodiment of the present invention will not be generated adequately.

Relationship Between Applied Voltage for Sticking Prevention Operation and Coercive Electric Field The relationship between the ratio of the voltage applied in driving to resolve device sticking, to the coercive electric field, and the sticking prevention effect was investigated. In an evaluation experiment, the sticking prevention effect was investigated using a piezoelectric film having the characteristics shown in FIGS. 1A to 1J, by applying a voltage so as to drive the piezoelectric film toward the positive side of the hysteresis, and thus driving the cantilever in a direction away from the switch electrode. The results are shown in Table 2.

TABLE 2

| Ratio of drive voltage with respect to coercive electric field | Sticking prevention effect |
| --- | --- |
| 150% | Poor |
| 100% | Average |
| 80% | Good |
| 70% | Good |
| 50% | Good |
| 30% | Good |
| 10% | Average |
| 0% | Poor |

Devices to which a voltage producing an applied electric field greater than the coercive electric field was applied (a ratio of 150% with respect to the coercive electric field; in this case, a voltage corresponding to an electric field of 52.5 kV/cm) showed no sticking prevention effect and were assigned an evaluation of "Poor".

In the case of an electric field equal to the coercive electric field (a ratio of 100% with respect to the coercive electric field), although a sticking effect was confirmed, as this driving was repeated and driving of the cantilever in a direction away from the electrode proceeded, the amount of displacement gradually declined, and therefore although there was a sticking prevention effect, reliability was somewhat degraded and the evaluation was "Average".

When the ratio with respect to the coercive electric field was 80% (in the present embodiment, approximately 28 kV/cm), a sticking prevention effect was observed, the situation upon repeated operation was also satisfactory, and a "Good" evaluation was assigned. When the devices were driven at 10% of the coercive electric field (approximately 3.5 kV/cm), there were some samples which produced sticking and some samples which did not produce sticking, and hence a satisfactory effect was not obtained and the evaluation was "Average". At 0%, the cantilever did not move at all and no prevention of sticking was achieved, and therefore the evaluation was "Poor".

From the results given above, when driving in order to prevent sticking, desirably, the device is driven in the range of 10% to 100% of the coercive electric field and more desirably, the device is driven in the range of 30% to 80% of the coercive electric field.

"Bias" in Pr-E Hysteresis Characteristics

The "bias" of the Pr-E hysteresis characteristics with respect to the electric field shown in FIG. 3 is defined, for example, by focusing on the difference between the absolute value of the coercive electric field on the positive field side and the absolute value of the coercive electric field on the negative field side. In the case of Pr-E hysteresis characteristics which are biased further toward the positive field side, the greater the bias, it is possible to determine a "bias rate" by the following formula, from the coercive electric field Ec1 on the negative field side and the coercive electric field Ec2 on the positive field side.

$$(Ec2+Ec1)/(Ec2-Ec1) \times 100 (\%)$$

In a piezoelectric body having Pr-E hysteresis characteristics biased toward the negative field side, the bias rate is the absolute value of the value obtained by this formula.

The method of driving an actuator element according to an embodiment of the present invention is especially desirable for application to an actuator including a piezoelectric body having Pr-E hysteresis with a bias rate of 20% or greater, and the higher the bias rate, the greater the beneficial effects achieved. The bias rate of the Pr-E hysteresis shown in FIG. 3 is 76%.

Composition of Piezoelectric Film

The piezoelectric film which can be used in implementing an embodiment of the present invention may be a piezoelectric film made of one type or a plurality of types of perovskite-type oxide which is expressed by the following General Formula (P) (the film may also include unavoidable impurities). This piezoelectric film can be formed on the substrate by sputtering using plasma. This piezoelectric film (General Formula (P)) has piezoelectric characteristics according to which the polarity of the coercive electric field having a smaller absolute value is negative, and the Pr-E hysteresis is biased toward the positive field side.

$A_aB_bO_3$                                General Formula (P)

In the formula, A represents A site element of which the main component is Pb; B represents B site element, at least one type of element selected from a group comprising Ti, Zr, V, Nb, Ta, Cr, Mo, W, Mn, Sc, Co, Cu, In, Sn, Ga, Zn, Cd, Fe and Ni; and O represents oxygen. A case where a≥1.0 and b=1.0 is standard, but these figures may deviate from 1.0 within a range which enables a perovskite structure to be obtained.

The perovskite-type oxide represented by the General Formula (P) described above may be lead titanate, lead titanate zirconate (PZT), lead zirconate, lead zirconate titanate niobate, or the like. The piezoelectric film may be a mixed crystalline system of a perovskite-type oxide as represented by the General Formula (P) stated above.

Furthermore, in implementing an embodiment of the present invention, a piezoelectric film made of one type or a plurality of types of perovskite-type oxide represented by the General Formula (P-1) below is especially desirable (the piezoelectric film may include unavoidable impurities).

$Pb_a(Zr_{b1}Ti_{b2}X_{b3})O_3$           General Formula (P-1)

In the Formula (P-1), X represents at least one type of metal element selected from the V and VI groups. The following relationship is satisfied: a>0, b1>0, b2>0, and b3≥0. A case where a≥1.0 and b1+b2+b3=1.0 is standard, but these figures may deviate from 1.0 within a range which enables a perovskite structure to be obtained.

The perovskite-type oxide represented by the General Formula (P-1) above is lead zirconate titanate (PZT) if b3=0, and if b3>0, then an oxide in which a part of the B site of PZT is substituted with X which is at least one type of metal element selected from the Group V and Group VI elements.

X may be any metal element of Group VA, Group VB, Group VIA and Group VIB and desirably, is at least one type element selected from the group consisting of V, Nb, Ta, Cr, Mo and W.

A piezoelectric film made of PZT oxide including a dopant which is represented by the General Formula (P-1) has a large bias rate to the positive field side in the Pr-E hysteresis characteristics, and therefore beneficial effects obtained by using the driving method of the piezoelectric actuator according to the embodiment of the present invention described above can be achieved successfully.

Furthermore, the larger the amount of lead, the greater the bias rate of the piezoelectric film 30 made of perovskite-type oxide represented by the General Formulas (P) and (P-1) described above. In the perovskite-type oxide represented by General Formulas (P) and (P-1), if the composition a of the lead is in the range of $1.02 < a \leq 1.3$, then the bias rate is 20% or above, and therefore it is possible successfully to obtain the beneficial effects achieved by using the method of driving a piezoelectric actuator according to the embodiment of the present invention described above.

Consequently, in a piezoelectric film 30 comprising a perovskite-type oxide represented by the General Formula (P-1), the greater the lead content, the greater the beneficial effects obtained by using the method of driving a piezoelectric actuator according to the embodiment of the present invention described above.

As stated previously, a piezoelectric film made of a perovskite-type oxide represented by the General Formulae (P) and (P-1) given above has a high piezoelectric distortion constant (d31 constant), and therefore the piezoelectric actuator (actuator element) including this piezoelectric film has excellent displacement characteristics.

Furthermore, as described in relation to FIGS. 2A to 2I, a piezoelectric actuator having a piezoelectric film made from a perovskite-type oxide represented by the General Formulae (P) and (P-1) has voltage-displacement characteristics with excellent linearity in the range of the drive voltage.

The description given above relates to PZT, but similar action and beneficial effects are obtained with any material having biased hysteresis in the properties of the piezoelectric body. In implementing the present invention, it is possible to use a material composition other than the composition described above, or to use a lead-free piezoelectric body, or the like.

Further Benefits of the Actuator Structure According to the Present Embodiment

In the case of a device structure of a piezoelectric body according to the present embodiment, desirably, the electrode (33) on the side of the structure (the lower wafer 18 in FIGS. 1A to 1J) is set to an earth potential and the electrode (26) on the side of the diaphragm 24 is set to a drive voltage for the piezoelectric driving. The reason for this is that, supposing that the side of the structure is set to a drive voltage, then there is a possibility of potential occurring in the substrate side (reference numeral 10) of the structure, via the structure (18).

In this respect, in a piezoelectric body manufactured by vapor phase epitaxy, the direction of polarization is liable to be biased as shown in FIG. 3. By using a material to attach a piezoelectric body to the side of the structure (see FIGS. 1G to 1J) in this way, it is possible to use the piezoelectric body so as to set the side of the structure to an earth potential and set the side of the diaphragm to a positive potential.

Supposing a composition where the side of the diaphragm is attached to the structure (in other words, a composition where a diaphragm, electrode, piezoelectric body and electrode are layered in this order on the structure), if the side of the diaphragm is set to an earth potential, then it is necessary to apply a negative potential to the electrode on the piezoelectric body. In this case, it is necessary to provide a driver (drive circuit) for generating a negative voltage, which is not versatile.

Furthermore, by adopting a composition in which the side of the piezoelectric body of a layered body in which a piezoelectric film 30 is layered on a diaphragm 24 is attached to the structure (lower wafer 18), as in the embodiment described in relation to FIGS. 1A to 1J, then it is possible to achieve a structure in which the rear surface side of the diaphragm 24 (the opposite side to the surface where the piezoelectric film 30 is provided, in other words, the front surface side of the switch 50) is made of a Si or $SiO_2$ material only. Consequently, it is possible to form a new device thereon, or to form a semiconductor element and circuit, such as a transistor.

On the other hand, if the side of the diaphragm is attached to the structure, then piezoelectric material will exist on the front surface of the switch, and therefore it is difficult to create a new device, or the like, on top of this.

Modification Example

In implementing the present invention, conditions for the material of the piezoelectric body, the material of the electrode material, the film forming, the film thickness dimensions, the drive voltage, and other conditions are not limited to those of the embodiments described above, but rather the invention can be implemented under various conditions.

Furthermore, the embodiments described above relate to a switch structure in which a plurality of fixed electrodes (12A, 12B) are arranged on a base substrate, and current is passed between the plurality of fixed electrodes by bringing a movable electrode 34 into contact with this plurality of fixed electrodes, but in implementing the present invention, it is also possible to adopt a switch structure in which a movable electrode is contacted with and separated from one fixed electrode.

Moreover, in the embodiment described above, a cantilever beam structure is given as an example, but the range of application of the present invention is not limited to this and can also be applied to a dual-support structure or a diaphragm structure.

Furthermore, in FIG. 1J, a piezoelectric film 30 is formed on the lower surface of the diaphragm 24 and a stress adjusting layer 25 is formed on the upper surface, but it is also possible to reverse this upper/lower positional relationship.

Further Application Examples

An actuator element using a piezoelectric film having the piezoelectric characteristics described above is able to produce a large amount of displacement compared to a related-art actuator and therefore is not restricted to a switch element, but rather can be used widely in applications of various kinds, such as an optical modulating element, and can also be employed in piezoelectric thin film elements and MEMS devices of various kinds.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An actuator comprising:
    a diaphragm having a thickness equal to or greater than 0.5 µm and equal to or less than 20 µm;
    a piezoelectric body layer which is provided on a first surface side of the diaphragm, and receives stress from the diaphragm;
    a pair of electrodes which is provided on the first surface side of the diaphragm together with the piezoelectric body layer, and is mutually opposing in a thickness direction of the piezoelectric body layer via the piezoelectric body layer; and
    a stress adjusting layer which is provided on a second surface side of the diaphragm on an opposite side to the first surface of the diaphragm in order to suppress warping of the diaphragm caused by a first stress acting on the first surface side, the first stress due to a difference in coefficients of thermal expansion of the diaphragm and the piezoelectric body layer, and receives stress from the diaphragm in a same direction as the stress that the piezoelectric body layer receives from the diaphragm, wherein warping of the diaphragm is suppressed by applying a second stress, balancing with the first stress on the first surface side, on the second surface side of the diaphragm by the stress adjusting layer, and wherein a coefficient of thermal expansion of the stress adjusting layer is greater than a coefficient of thermal expansion of the diaphragm, and is equal to or greater than 5 ppm/° C.

2. The actuator as defined in claim 1, wherein the stress that the piezoelectric body layer receives from the diaphragm is tensile stress which has a stress value equal to or greater than 50 MPa and equal to or less than 500 MPa.

3. The actuator as defined in claim 1, wherein the diaphragm is made of silicon (Si) or silicon dioxide ($SiO_2$) or a combination of these.

4. An actuator structure comprising:
the actuator as defined in claim 1; and
a structure joined to a side of the piezoelectric body of the actuator,
wherein the structure has a recess section forming a space that allows a movable part of the actuator to be displaced, on a side of the piezoelectric body layer of the actuator.

5. The actuator structure as defined in claim 4, wherein, in a state where no voltage is applied between the pair of electrodes, the piezoelectric body layer is polarized in a direction such that a side of the structure is positive and a side of the diaphragm is negative.

6. The actuator structure as defined in claim 5, wherein:
when a drive voltage is applied to the pair of electrodes, the movable part is displaced in a direction to enter inside the recess section of the structure, and
of a coercive electric field on a positive field side and a coercive electric field on a negative field side in polarization (Pr)-electric field (E) hysteresis characteristics, if a coercive electric field in a field direction during driving by application of the drive voltage is taken to be $Ec\_a$, and a coercive electric field in a field direction during driving by application of a voltage in an opposite direction to the drive voltage is taken to be $Ec\_b$, then $|Ec\_b|>|Ec\_a|$ is satisfied.

7. The actuator structure as defined in claim 4, wherein the movable part is supported by a cantilever structure.

8. The actuator as defined in claim 1, wherein a stress value of the stress adjusting layer is 0.1 to 10 times a stress value of the piezoelectric layer.

9. The actuator as defined in claim 1, wherein a stress value of the stress adjusting layer is 0.3 to 5 times a stress value of the piezoelectric layer.

10. The actuator as defined in claim 1, wherein a stress value of the stress adjusting layer is 0.6 to 2 times a stress value of the piezoelectric layer.

11. The actuator as defined in claim 1, wherein the stress adjusting layer is composed of inorganic material.

12. The actuator as defined in claim 11, wherein the inorganic material includes at least one of metal materials, metal oxides, metal nitrides, and composites thereof.

13. The actuator as defined in claim 12, wherein the metal materials include intermediate materials that are between metals and non-metals.

14. The actuator as defined in claim 13, wherein the intermediate materials include at least one of C, Si, Sb, Bi.

* * * * *